United States Patent [19]

Fowler

[11] Patent Number: 5,105,548

[45] Date of Patent: * Apr. 21, 1992

[54] APPARATUS AND METHOD FOR DETERMINING AZIMUTH, PITCH AND ROLL

[75] Inventor: John T. Fowler, Marblehead, Mass.

[73] Assignee: DigiCourse, Inc., Harahan, La.

[*] Notice: The portion of the term of this patent subsequent to Sep. 24, 2008 has been disclaimed.

[21] Appl. No.: 635,341

[22] Filed: Dec. 28, 1990

Related U.S. Application Data

[63] Continuation of Ser. No. 427,894, Oct. 20, 1989, Pat. No. 5,010,653, which is a continuation of Ser. No. 162,007, Feb. 29, 1988, abandoned.

[51] Int. Cl.⁵ .................. E01C 17/38; E01C 17/28
[52] U.S. Cl. ................................ 33/356; 33/361; 324/247; 324/258; 324/260
[58] Field of Search ............... 33/356, 361, 362, 316, 33/319; 73/1 E; 324/244, 247, 253, 258, 260

[56] References Cited

U.S. PATENT DOCUMENTS

| | | | |
|---|---|---|---|
| 2,706,801 | 4/1955 | Tolles | 324/43 |
| 2,834,939 | 5/1958 | Tolles | 324/43 |
| 3,772,503 | 11/1973 | Fowler | 235/150.5 |
| 3,833,901 | 9/1974 | Fowler | 340/347 P |
| 3,936,949 | 2/1976 | Devaud | 33/352 |
| 3,975,621 | 8/1976 | Fowler | 235/150.26 |
| 4,031,630 | 6/1977 | Fowler | 33/356 |
| 4,091,543 | 5/1979 | Lapeyre | 33/356 |
| 4,109,199 | 8/1978 | Ball et al. | 324/202 |
| 4,327,498 | 5/1982 | Setter et al. | 33/333 |
| 4,373,271 | 2/1983 | Nitz | 33/361 |
| 4,439,732 | 3/1984 | Hesterman et al. | 324/247 |
| 4,462,165 | 7/1984 | Lewis | 33/361 |
| 4,463,314 | 7/1984 | Wilson | 324/244 |
| 4,698,912 | 10/1987 | Fowler et al. | 33/356 |

FOREIGN PATENT DOCUMENTS 57-116211  7/1982  Japan.

Primary Examiner—William A. Cuchlinski, Jr.
Assistant Examiner—Alvin Wirthlin
Attorney, Agent, or Firm—James T. Cronvich

[57] ABSTRACT

Apparatus and method for determining the azimuth (heading), pitch and roll which include a magnetometer-type sensor providing signals measured in three axes relative to a reference frame, and coil elements wound around the magnetometer which selectively impose specific magnetic fields about the sensor. Three axes field components of the magnetic field are measured from the sensor with and without the selective energization of the magnetic coils and stored, from which the azimuth, pitch and roll are calculated. Furthermore, quadrant correction is applied such that a unique reading is produced for all angles through 360° of azimuth, pitch or roll.

10 Claims, 2 Drawing Sheets

APPARATUS AND METHOD FOR DETERMINING AZIMUTH, PITCH AND ROLL

RELATED CASES

This application is a continuation of application Ser. No. 07/427,894, filed Oct. 20, 1989, issued as U.S. Pat. No. 5,010,653, which is a continuation of application Ser. No. 07/162,007, filed Feb. 29, 1988 (now abandoned).

FIELD OF THE INVENTION

The present invention relates to compass apparatus and, in particular, compass apparatus which further provides azimuth, pitch and roll signals.

BACKGROUND OF THE INVENTION

In compasses which incorporate magnetometers having two orthogonally disposed flux gate elements which provide signals from which an azimuth (heading) is calculated, the pitch and roll of the vessel or platform to which the compass is attached is also of interest for itself and because it may affect the azimuth calculations. Therefore, pitch and roll signals are desired as well as the heading signal. However, separately derived signals are not as good as actually measuring the pitch and roll of the gimbaled platform.

BRIEF DESCRIPTION OF THE DRAWING

These and other features of the present invention will be better understood by reading the following detailed description, taken together with the drawing wherein:

FIG. 1A is a cross-section view of the pitch and roll coils surrounding the sensor.

DETAILED DESCRIPTION OF THE INVENTION

Figure 1:
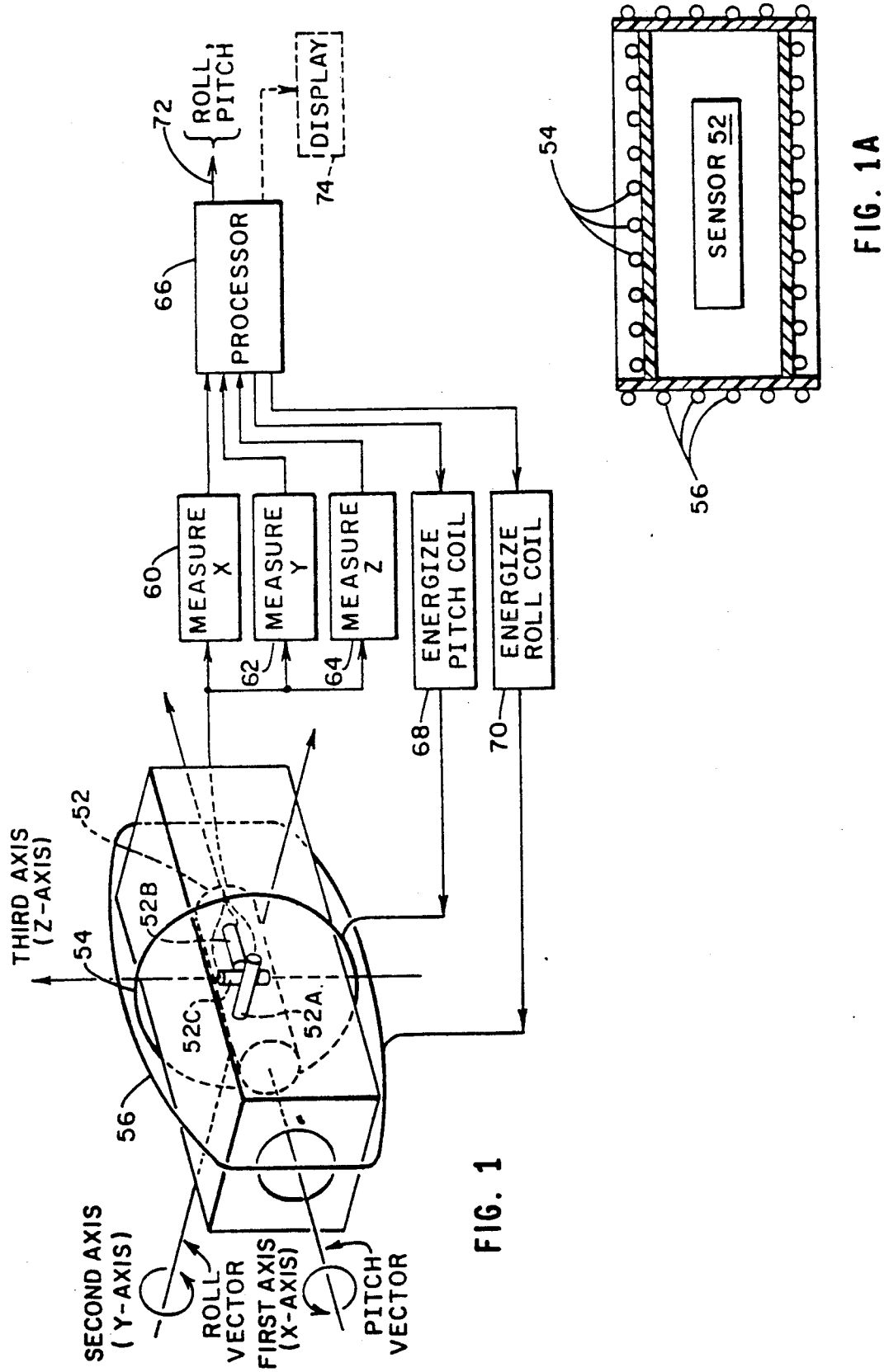
FIG. 1 is a block diagram of one embodiment of the present invention.

A block drawing of one embodiment of the system is shown in FIG. 1 wherein a sensor 52, containing three orthogonal magnetic field sensing elements 52A, 52B and 52C, typically flux gates, is movably retained within a structure having a pitch coil 54 and a roll coil 56 disposed thereabout to selectively provide a predetermined DC magnetic field for the process described below. The particular proportions of the pitch and roll coils 54 and 56 are shown more clearly in FIG. 1A, wherein the coils 54 and 56 comprise solenoidally-wound coils which extend beyond the sensor 52 such that the lines of flux produced by the respective coils are substantially parallel and distributed substantially uniformly in the sensor 52. The three orthogonal magnetic field sensing elements 52A, 52B and 52C of the sensor 52 define a reference frame for the determination of roll of the structure about the Y axis and pitch of the structure about the X axis.

The signals derived by the individual flux gates in the sensor 52 are measured by elements 60, 62 and 64, and received by and stored in a processor 66. The processor sequentially and selectively energizes the pitch and roll coils 54 and 56 according to control signals applied to energization circuits 68 and 70, respectively. The resulting calculated pitch, roll and azimuth is provided on output leads 72 and/or selectively displayed on a display 74.

The embodiment, according to the present invention, includes a processor 66 which typically comprises a microprocessor such as the Intel MCS 48 Series Microprocessor, the Motorola 6800 Series Microprocessor or equivalent thereof, and is programmed according to the following process according to the present invention by one of skill in the art.

Figure 2:
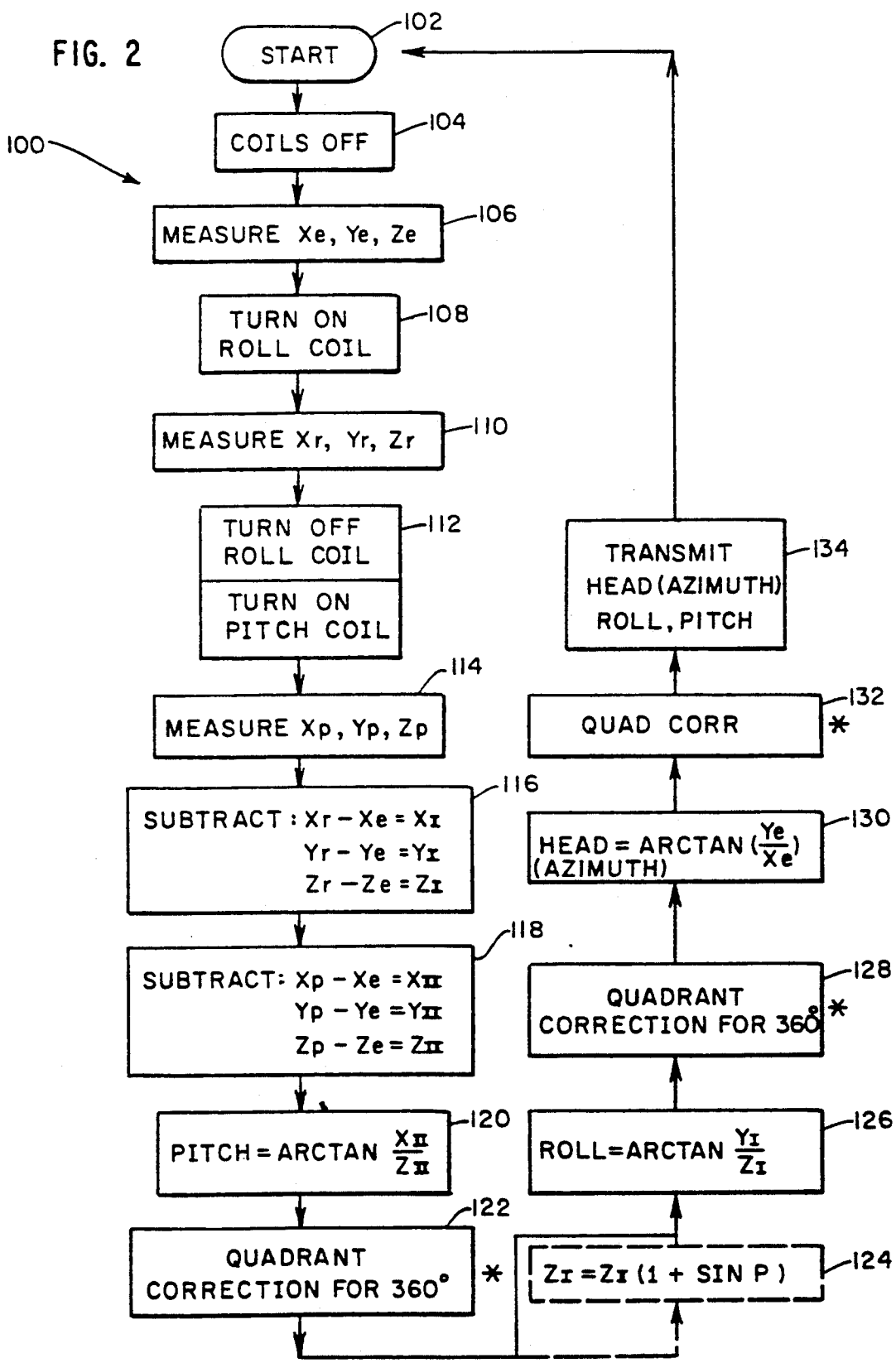
FIG. 2 is a flow chart of the process calculating the azimuth, pitch and roll according to one embodiment of the present invention.

The process of the present invention provides a periodic update of the pitch, roll and azimuth signals. One embodiment of the process is shown in the flow chart 100 in FIG. 2 wherein the process begins at step 102, and turns the coils off at step 104 so that the X, Y and Z signals provided by the sensor 52 and measured by elements 60, 62 and 64, noted as Xe, Ye and Ze, correspond only to the ambient magnetic field (e.g. of the Earth). The measurement is provided at step 106. Subsequently, the roll coil 56 is energized producing a magnetic field along an axis orthogonal to the direction of the windings of roll coil 56 at step 108 and the three orthogonal signals are measured at step 110 wherein the signals are noted as Xr, Yr and Zr. Subsequently, the roll coil 56 is de-energized and the pitch coil 54 is energized producing a magnetic field along an axis orthogonal to the direction of the windings of pitch coil 54 at step 112. The signals from the sensors are measured at step 114, providing the Xp, Yp and Zp signals, comprising the ambient Earth magnetic field and the field imposed by the pitch coil. Preferably, the above steps of measuring the sensor signals with and without energization of the particular roll and pitch coils is accomplished in a short interval, such as 15 milliseconds, in order to provide a "snapshot" of the ambient field conditions. If an extended period of time between the readings exists so that the platform to which the compass is attached changes its relative position, changes in ambient field conditions will cause erroneous calculations of the desired signals.

The signals derived when all coils are off (Xe, Ye and Ze) are subtracted respectively from the signals (Xr, Yr and Zr) derived when the roll coil is energized, resulting in difference signals XI, YI and ZI at step 116. Similarly, the signals measured when the coils are not energized are subtracted, at step 118, from the signals (Xp, Yp and Zp) derived when the pitch coil is energized, providing signals XII, YII and ZII.

In step 120, the pitch (P) is calculated according to the arctangent of XII/ZII. In step 122, a quadrant correction is applied such that if the value of XII is less than 0, 180° is added to the value of pitch, and if the value of XII is greater than 0 and the value of ZII is less than 0, a value of 360° is added to the calculated value of pitch. Subsequently, at step 124, the value of ZI is multiplied by 1+sin P where P is the calculated pitch angle.

The roll (R) is calculated at step 126 according to the arctangent of YI/ZI, and is corrected at the optional step 128, which incorporates the quadrant correction according to step 122 as applied to the calculated roll angle.

The azimuth ($\theta$) is calculated at step 130 according to the arctangent of the initially measured values of Ye/Xe. Quadrant correction is applied at the optional step 132, incorporating the procedure of step 122, discussed above, as applied to the calculated azimuth angle.

Finally, the calculated azimuth, pitch and roll values are transmitted to the external apparatus or to the display 74 at step 134, whereupon the method of determining azimuth, pitch and roll according to the present invention is begun again at step 102.

Modifications and substitutions made by one of skill in the art are considered to be within the scope of the present invention which is not to be limited except by the claims which follow:

What is claimed is:

1. A method for determining orientation relative to a reference frame having first, second, and third mutually orthogonal axes comprising the steps of:
   measuring an ambient magnetic field to determine a first set of three substantially independent field components relative to said reference frame, including a first-axis component represented as Xe, a second-axis component represented as Ye, and a third-axis component represented as Ze;
   applying a first predetermined magnetic field in a direction substantially orthogonal to said second axis relative to said reference frame;
   measuring a second set of three substantially independent composite field components relative to said reference frame, representing a composite magnetic field comprising the ambient magnetic field and said first predetermined magnetic field, including a second first-axis component represented as Xp, a second second-axis component represented as Yp, and a second third-axis component represented as Zp;
   determining a value corresponding to azimuth according to the arctangent of (Ye/Xe);
   determining a value P corresponding to pitch, according to the arctangent of [(Xp-Xe)/(Zp-Ze)]; and
   providing signals corresponding to azimuth and pitch.

2. The method of claim 1, further including the steps of:
   removing said first predetermined magnetic field substantially orthogonal to said second axis;
   applying a second predetermined magnetic field substantially orthogonal to the direction of said first predetermined magnetic field;
   measuring a third set of three substantially independent composite field components relative to said reference frame, representing a composite magnetic field comprising the ambient magnetic field and said second predetermined magnetic field, including a third first-axis component represented as Xr, a third second-axis component represented as Yr, and a third third-axis component represented as Zr;
   determining a value corresponding to roll according to the arctangent of [(Yr-Ye)/(Zr-Ze)]; and
   providing a signal corresponding to roll.

3. The method of claim 1, further including the steps of:
   removing said first predetermined magnetic field substantially orthogonal to said second axis;
   applying a second predetermined magnetic field substantially orthogonal to the direction of said first predetermined magnetic field;
   measuring a third set of three substantially independent composite field components relative to said reference frame, representing a composite magnetic field comprising the ambient magnetic field and said second predetermined magnetic field, including a third first-axis component represented as Xr, a third second-axis component represented as Yr, and a third third-axis component represented as Zr;
   determining a value corresponding to roll according to the arctangent of [(Yr-Ye)/(Zr-Ze)(1+sinP)]; and
   providing a signal corresponding to roll.

4. Apparatus for determining orientation of a movable platform in accordance with a reference frame comprising first, second, and third mutually orthogonal axes, comprising:
   a magnetometer having sensing elements operable in first, second, and third mutually orthogonal axes corresponding to said first, second, and third mutually orthogonal axes of said reference frame;
   means for deriving a first-axis field component represented as Xe, a second-axis field component represented as Ye, and a third-axis field component represented as Ze;
   means for applying a first substantially uniform magnetic field proximate to said magnetometer and in a direction substantially orthogonal to said second axis of said reference frame in response to a first signal;
   means for deriving a second first-axis field component represented as Xp, a second second-axis field component represented as Yp, and a second third-axis field component represented as Zp;
   means for computing a value P corresponding to pitch according to the arctangent of [(Xp-Xe)/(Zp-Ze)]; and
   output means for providing output signals corresponding to pitch.

5. The apparatus of claim 4, further including:
   means for applying a second substantially uniform magnetic field proximate to said magnetometer and substantially orthogonal to the direction of said first uniform magnetic field in response to a second signal;
   means for deriving a third first-axis field component represented as Xr, a third second-axis field component represented as Yr, and a third third-axis field component represented as Zr;
   means for computing a value for roll according to the arctangent of [(Yr-Ye)/(Zr-Ze)]; and
   output means for providing output signals corresponding to roll.

6. The apparatus of claim 5, further including:
   means for determining a value corresponding to azimuth according to the arctangent of (Ye/Xe); and
   output means for providing output signals corresponding to azimuth.

7. The apparatus of claim 4, further including:
   means for applying a second substantially uniform magnetic field proximate to said magnetometer and substantially orthogonal to the direction of said first uniform magnetic field in response to a second signal;
   means for deriving a third first-axis field component represented as Xr, a third second-axis field component represented as Yr, and a third third-axis field component represented as Zr;
   means for computing a value for roll according to the arctangent of [(Yr-Ye)/(Zr-Ze)(1+sinP)]; and
   output means for providing output signals corresponding to roll.

8. The apparatus of claim 7, further including:

means for determining a value corresponding to azimuth according to the arctangent of (Ye/Xe); and output means for providing output signals corresponding to azimuth.

9. Apparatus for determining roll of a movable platform in accordance with a reference frame comprising first, second and third mutually orthogonal axes, comprising:

a magnetometer having sensing elements operable in first, second and third mutually orthogonal axes corresponding to said first, second and third mutually orthogonal axes of said reference frame;

means for deriving a first-axis field component represented as Xe, a second-axis field component represented as Ye and a third-axis field component represented as Ze;

means for applying a substantially uniform magnetic field proximate to said magnetometer and substantially orthogonal to said first axis of said reference frame;

means for deriving a second first-axis field component represented as Xr, a second second-axis field component represented as Yr, and a second third-axis field component represented as Zr;

means for computing a value corresponding to roll according to the arctangent [(Yr Ye)/(Zr-Ze)]; and output means for providing output signals corresponding to roll.

10. The apparatus of claim 9, further including:

means for determining a value corresponding to azimuth according to the arctangent of (Ye/Xe); and output means for providing output signals corresponding to azimuth.

* * * * *